United States Patent
Sebastian

(10) Patent No.: US 10,644,717 B1
(45) Date of Patent: May 5, 2020

(54) PHASE ACCUMULATION DIGITAL-TO-ANALOG CONVERTER (DAC)

(71) Applicant: IQ-Analog Corporation, San Diego, CA (US)

(72) Inventor: Sunit Paul Sebastian, San Diego, CA (US)

(73) Assignee: IQ-Analog Corporation, San Diego, CA (US)

( * ) Notice: Subject to any disclaimer, the term of this patent is extended or adjusted under 35 U.S.C. 154(b) by 0 days.

(21) Appl. No.: 16/749,447

(22) Filed: Jan. 22, 2020

(51) Int. Cl.
*H03M 1/82* (2006.01)

(52) U.S. Cl.
CPC ................................ *H03M 1/82* (2013.01)

(58) Field of Classification Search
CPC ...................................................... H03M 1/82
USPC .................................................. 341/152, 166
See application file for complete search history.

(56) References Cited

U.S. PATENT DOCUMENTS

| | | | | |
|---|---|---|---|---|
| 7,050,467 B1 * | 5/2006 | Martin | ............ | H03K 5/135 327/141 |
| 9,362,936 B1 * | 6/2016 | Caffee | ............ | H03K 5/135 |

OTHER PUBLICATIONS

Gordon W. Roberts et al., "A Brief Introduction to Time-to-Digital and Digital-to-Time Converters", IEEE Transactions on Circuits and Systems II: Express Briefs, 2010.

Jiayoon Zhiyu Ru et. al., "A high-linearity digital-to-time converter technique: constant-slope charging", IEEE Journal of Solid-State Circuits, 2015.

Pavan Kumar Hanumolu et. al., "A Sub-Picosecond Resolution 0.5-1.5 GHz Digital-to-Phase Converter", IEEE Journal of Solid-State Circuits, 2008.

Nereo Markulic et. al., "A 10-bit, 550-fs step Digital-to-Time Converter in 28nm CMOS", European Solid State Circuits Conference, 2014.

Babak Jamli, Aydin Babakhani, "A 0.2-2.6GHz instantaneous frequency-to-voltage converter in 90nm CMOS", IEEE Radio and Wireless Symposium, 2016.

Tian Xia, Jien-Chung Lo, "Time-to-Voltage Converter for On-Chip Jitter Measurement", IEEE Transactions on Instrumentation and Measurement, 2003.

Jungho Kim et. al., "A Hybrid-Domain Two-Step Time-to-Digital Converter Using a Switch-Based . . . ", IEEE Transactions on Circuits and Systems II: Express Briefs, 2015.

* cited by examiner

*Primary Examiner* — Khai M Nguyen
(74) *Attorney, Agent, or Firm* — Law Offices of Gerald Maliszewski; Gerald Maliszewski

(57) ABSTRACT

A phase accumulation digital-to-analog converter (DAC) is provided. A digital-to-time converter (DTC), including a reference clock chain with N number of series connected delay elements, accepts a clock signal with a leading clock edge and supplies a set signal representing a first delay of the leading clock edge. A data clock chain including N number of series connected accumulators, accepts the clock signal with the leading clock edge, accepts a binary coded digital word, and supplies a reset signal representing a second delay of the leading clock edge, responsive to the digital word. A phase-to-time logic (PTL) receives the set and reset signals and supplies a DTC output signal representing the difference in delay between the set and reset signals. A time-to-voltage converter (TVC) charges a load capacitor every clock period in response to the DTC output signal to supply an analog output signal.

16 Claims, 10 Drawing Sheets

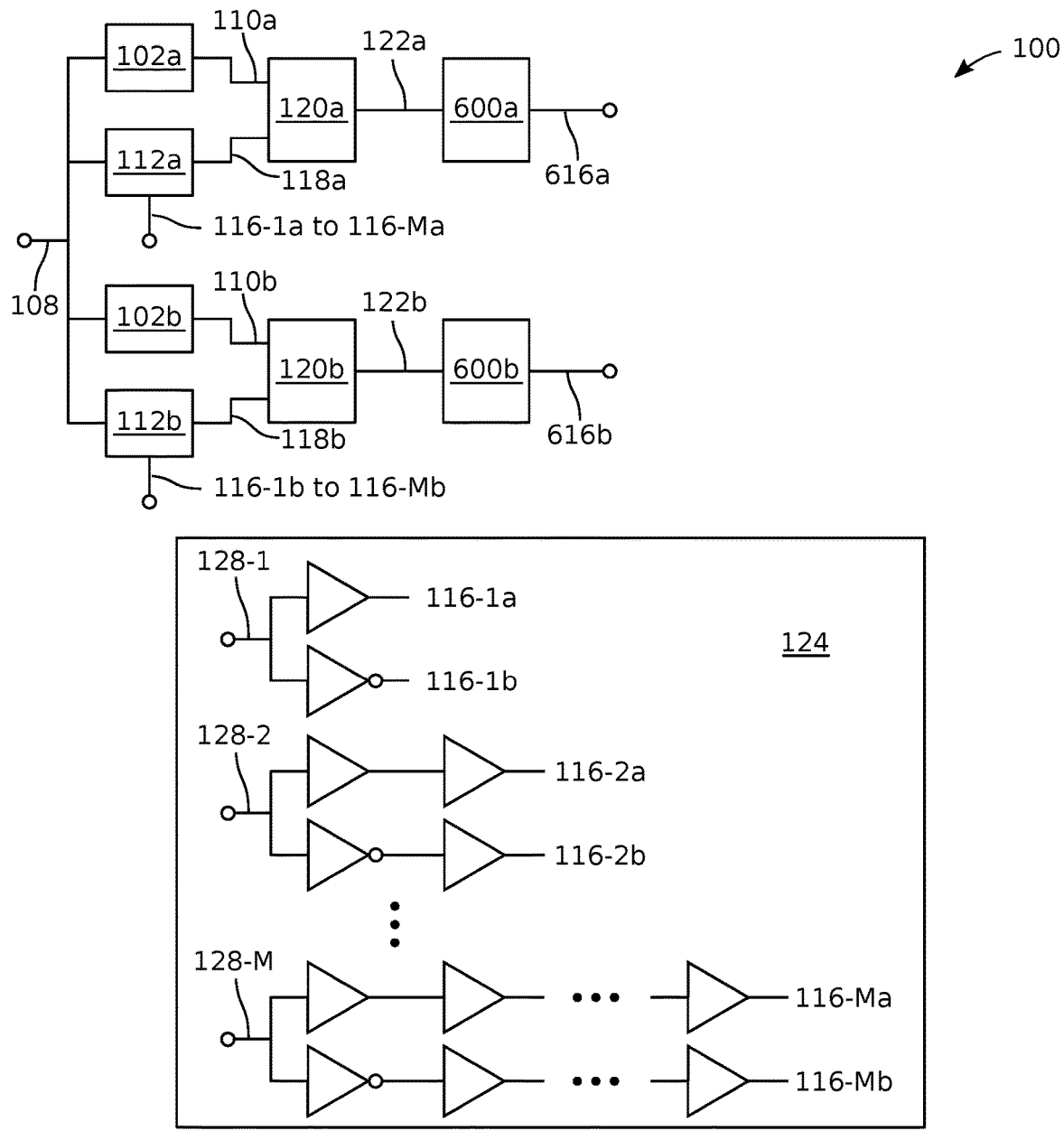
Fig. 8
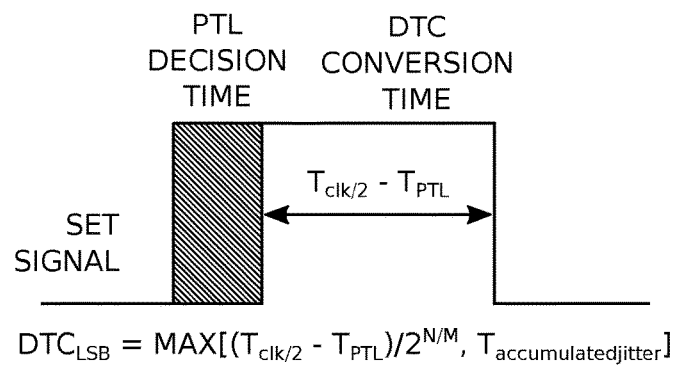
Fig. 9
Fig. 10

PHASE ACCUMULATION DIGITAL-TO-ANALOG CONVERTER (DAC)

RELATED APPLICATIONS

Any and all applications, if any, for which a foreign or domestic priority claim is identified in the Application Data Sheet of the present application are hereby incorporated by reference under 37 CFR 1.57.

BACKGROUND OF THE INVENTION

1. Field of the Invention

This invention generally relates to digital-to-analog conversion circuitry and, more particularly, to a digital-to-analog converter (DAC) that operates on the principle of digital-to-time phase accumulation.

2. Description of the Related Art

At the time of this writing, gigahertz state-of-the-art DACs use a current-steering architecture to operate at high speeds with sufficient linearity. However, the power consumption and area of the DACs increase with a power of 2 for every extra bit of resolution to maintain the same linearity. The sizes of the analog components are quite large and take up a huge portion of the overall area. To obtain a high linearity, the output impedance of the DAC must be very large, which is achieved by cascading several transistors in series. However, in low voltage technologies where the supply voltage is limited to 0.8V (volts), the voltage headroom is insufficient to stack several transistors in series. Hence, cascading transistors would require higher potential voltage supplies (1.2V and above), which is an additional design and layout effort.

One type of DAC architecture converts a digital signal (i.e., a digital words comprising a sequence of binary coded bits) to time (i.e., a pulse width modulated signal) using a digital-to-time converter (DTC), and then converts the time signal to an analog voltage using a time-to-voltage converter (TVC). Conventional DTCs have been designed using voltage controlled delay units as in [1]; constant slope charging as in [2]; Vernier delay line DLL in [3] and RC based inverter delay cells in [4]. The phase difference detection in the DTC was solved using D flip-flops in [1]; multiplexers in [3] and comparators in [2] & [4]. The time-to-voltage converters in earlier designs conventionally use an integrator approach along with charge pumps as in [5], [6], and [7].

1. Gordon W. Roberts, Mohammad Ali-Bakshian, A Brief Introduction to Time-to-Digital and Digital-to-Time Converters, IEEE Transactions on Circuits and Systems II; Express Briefs, 2010.
2. Jiayoon Zhiyu Ru et al., A high-linearity digital-to-time converter technique: constant-slope charging, IEEE Journal of Solid-State Circuits, 2015.
3. Pavan Kumar Hanumolu et al., A Sub-Picosecond Resolution 0.5-1.5 GHz Digital-to-Phase Converter, IEEE Journal of Solid-State Circuits, 2008.
4. Nereo Markulic et al., A 10-bit, 550-fs step Digital-to-Time Converter in 28 nm CMOS, European Solid State Circuits Conference, 2014.
5. Babak Jamli, Aydin Babakhani, A 0.2-2.6 GHz instantaneous frequency-to-voltage converter in 90 nm CMOS, IEEE Radio and Wireless Symposium, 2016.
6. Tian Xia, Jien-Chung Lo, Time-to-Voltage Converter for On-Chip Jitter Measurement, IEEE Transactions on Instrumentation and Measurement, 2003.
7. Jungho Kim et al., A Hybrid-Domain Two-Step Time-to-Digital Converter Using a Switch-Based Time-to-Voltage Converter and SAR ADC, IEEE Transactions on Circuits and Systems II: Express Briefs, 2015.

It would be advantageous if the DTC and TVC of a DAC could be made with a minimum of analog components, to reduce current consumption and physical size.

SUMMARY OF THE INVENTION

Disclosed herein is a phase accumulation digital-to-analog converter (DAC) using a digital-to-time converter (DTC), a phase-to-time logic (PTL), and a time-to-voltage converter (TVC). The design primarily uses digital cells while keeping the analog components to a minimum. Since the area and power consumption do not scale with a power of 2, as in conventional designs, the resolution can be increased, as the configuration is very flexible. The circuitry can operate at gigahertz (GHz) frequencies with a single 0.8 volt (V) supply, resulting in a very small area, lower power consumption, and simple layout.

The DTC is made up of delay stages or accumulators that are made up of buffers (delay elements), capacitors, and switches. The capacitors are sized depending on the data bit that activates it, for example, $C_1 = C_x$, $C_2 = 2 \cdot C_x$, $C_3 = 3 \cdot C_x$, ..., $C_N = 2^{N-1} \cdot C_x$ where $C_x$ is the unit capacitance. When the switch is turned on by a data bit, the capacitor is grounded. This capacitor is charged and discharged as the clock transitions through the accumulator, providing a delay proportional to the weight of the capacitor. As no extra static power is consumed, this results in a considerable power savings.

Accordingly, a phase accumulation digital-to-analog converter is provided that includes a digital-to-time converter. The DTC includes a reference clock chain with N number of series connected delay elements. The reference clock chain has an input to accept a clock signal with a leading clock edge and an output to supply a set signal representing a first delay of the leading clock edge, where the first delay duration is less than a clock signal period. The DTC also includes a data clock chain with N number of series connected accumulators. The data clock chain has an input to accept the clock signal with the leading clock edge, an input to accept a binary coded digital word, and an output to supply a reset signal representing a second delay of the leading clock edge, responsive to the digital word. The second delay is less than or equal to the clock signal period. A phase-to-time logic has inputs to receive the set and reset signals and an output to supply a DTC output signal representing a difference in delay between the set and reset signals.

Each accumulator includes a delay element having an input to accept a leading clock edge and an output to supply a delayed leading clock edge. The accumulator also includes a data capacitor having a first terminal connected to the output of the delay element and a second terminal, where each data capacitor has a weighted capacitance value responsive to the significance of a corresponding data bit in the digital word. A data switch has a first terminal connected to the second terminal of the data capacitor and a second terminal connected to a first reference voltage, and it is selectively closed in response to the binary value of a corresponding bit in the digital word.

The DTC further also includes a data buffer made up on N number of data buffer chains. Each data buffer chain has an input to accept a corresponding data bit from the digital word, and an output to selectively close the data switch in a corresponding accumulator in response to the binary value of the data bit. Each data buffer chain includes a number of series connected delay elements responsive to the significance of the data bit in the digital word.

The PTL is made up of a first p-type metal-oxide-semiconductor (PMOS) transistor has a first source/drain (S/D) connected to a second reference voltage having a higher potential than the first reference voltage, a gate to accept an inverted reset signal with a first delay, and a second S/D. A first n-type metal-oxide-semiconductor (NMOS) transistor has a first S/D connected to the second S/D of the first PMOS, a gate to accept a delayed set signal with the first delay, and a second S/D. A second NMOS transistor has a first S/D connected to the second S/D of the first NMOS, a gate to accept the inverted reset signal, and a second S/D connected to the first reference voltage. A second PMOS transistor has a first S/D connected to the second reference voltage, a gate connected to the second S/D of the first NMOS, and a second S/D to provide the DTC output signal. A third NMOS transistor has a first S/D connected to the second S/D of the second PMOS, a gate to accept a delayed reset signal with the first delay, and a second S/D connected to the first reference voltage.

More explicitly, the set signal has a duty cycle with a first portion of a period, initiated by a set signal leading clock edge, followed by a second portion of the period, initiated by a following clock edge opposite in polarity to the leading clock edge, wherein the second portion is divided into an initial section and a trailing section. Finally, the DAC further includes a time-to-voltage converter (TVC) that includes a charger. The charger includes a first switch having a first terminal and a second terminal that is selectively closed in response to the DTC output signal. A current source connects the second reference voltage to the first terminal of the first switch. The TVC also includes a load capacitor, buffer amplifier, second switch, and third switch. The load capacitor has a first terminal connected to the second terminal of the first switch and a second terminal connected to the first reference voltage. The buffer amplifier has a non-inverting input, an inverting input, and an output connected to the inverting input, to supply an analog output signal. The second switch has a first terminal connected to the first terminal of the load capacitor and a second terminal connected to the non-inverting input of the buffer amplifier. The second switch is selectively closed during the initial section of the set signal second portion. The third switch has a first terminal connected to the first terminal of the load capacitor and a second terminal connected to the first reference voltage. The third switch is selectively closed during the trailing section of the set signal second portion.

Additional details of the above-described DAC as well as a phase accumulation method for converting a digital word to an analog signal are provided below.

BRIEF DESCRIPTION OF THE DRAWINGS

FIG. 8 is a schematic block diagram of a differential version of the DAC of FIG. 1.

FIG. 9 is a diagram of the PTL truth table.

FIG. 10 is a diagram depicting the overall conversion time for a DTC chain.

DETAILED DESCRIPTION

Figure 1:
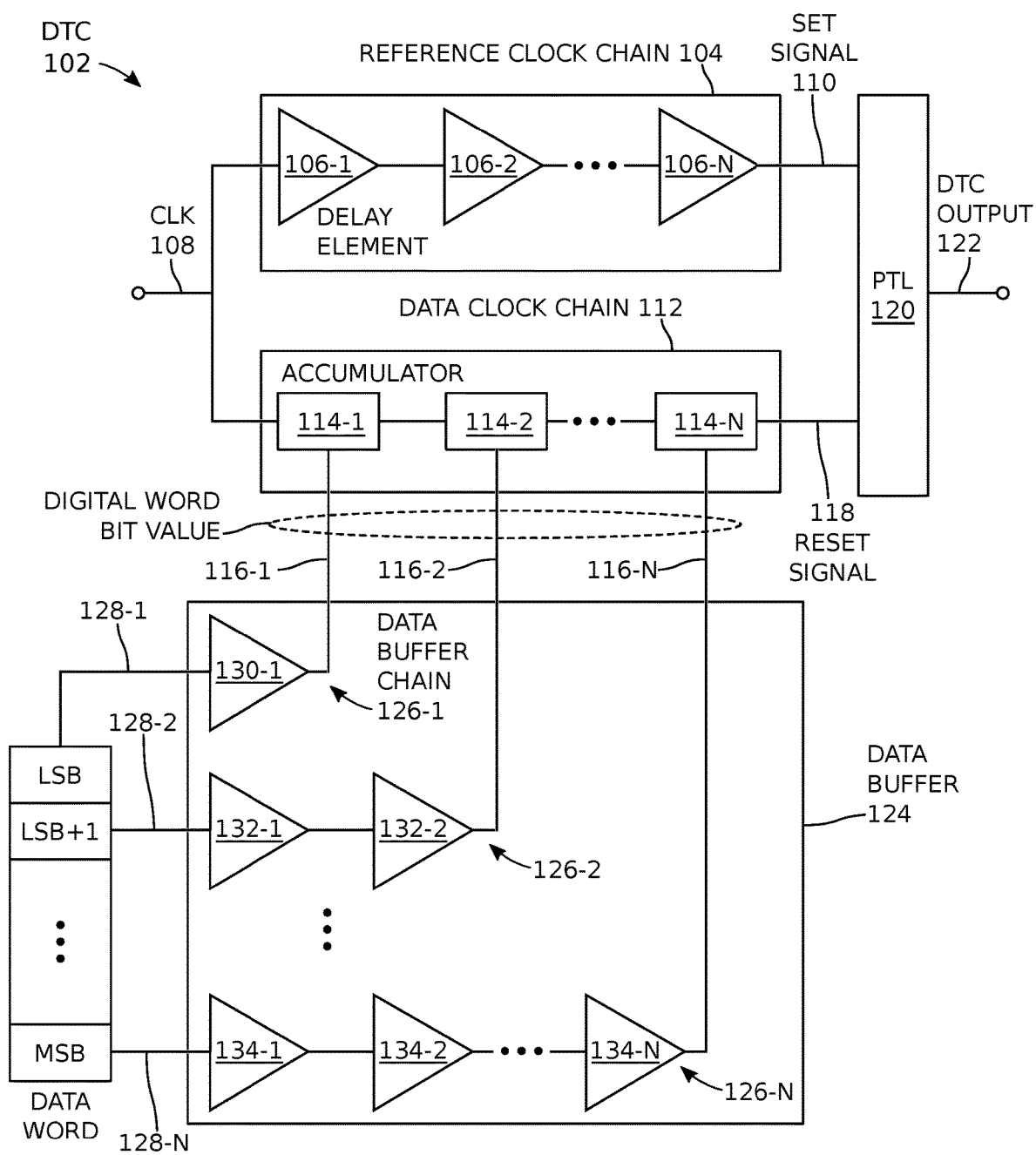
FIG. 1 is a schematic block diagram of a digital-to-time converter for a phase accumulation digital-to-analog converter (DAC).
Figure 5:
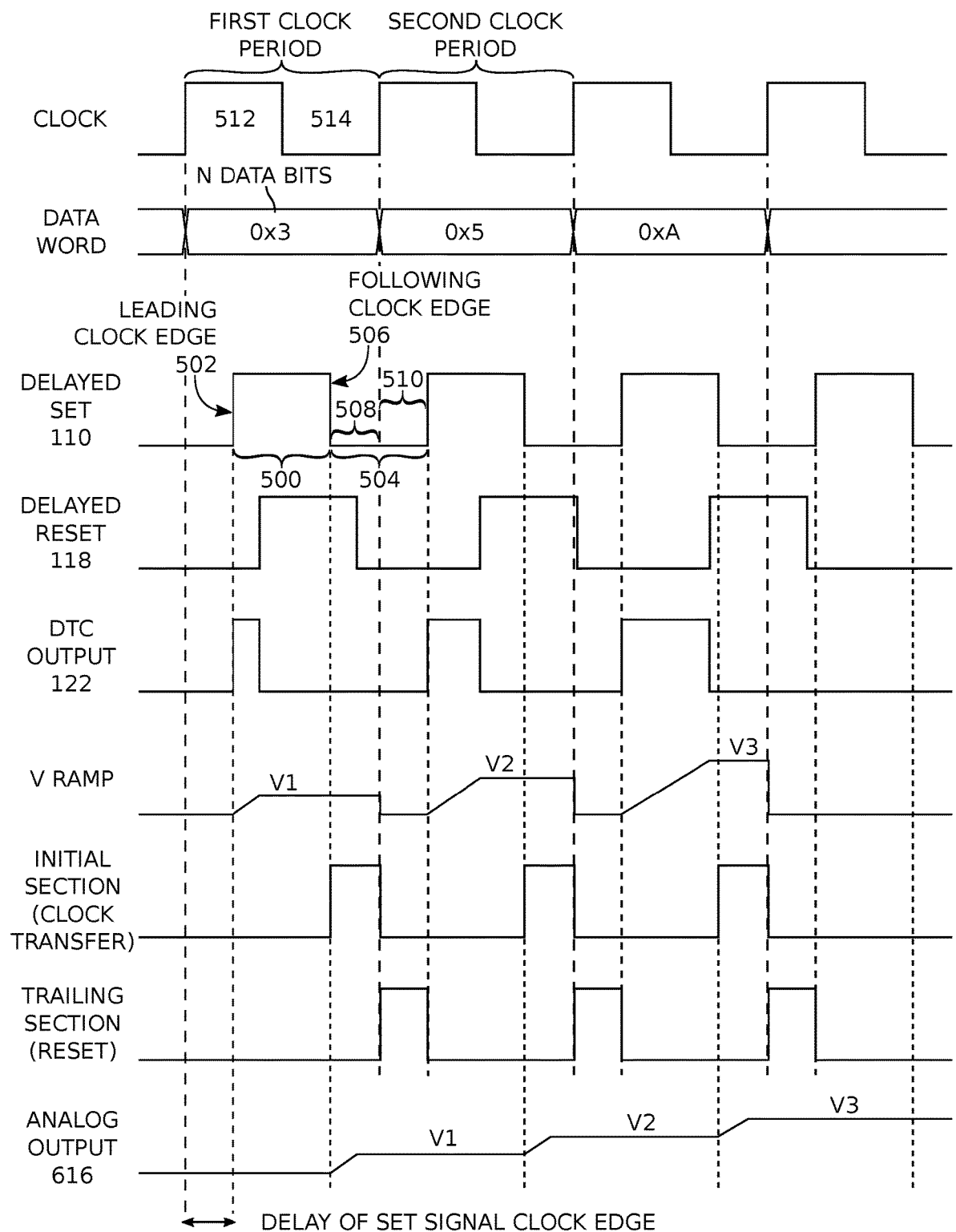
FIG. 5 is a timing diagram.

FIG. 1 is a schematic block diagram of digital-to-time converter for a phase accumulation digital-to-analog converter (DAC). The DAC comprises a digital-to-time converter (DTC) 102, which comprises a reference clock chain 104. The reference clock chain 104, in turn, comprises N number of series connected delay elements 106-1 through 106-N, where N is an integer greater than or equal to 1. In one aspect the delay elements are buffers, a circuit that is well known in the art. However, the delay elements of the reference clock chain, the data clock chain, and data buffer (described below) are not limited to any particular delay mechanism, and may be enabled using active, passive, or a combination of active and passive components. The reference clock chain 104 has an input on line 108 to accept a clock signal (CLK) with a leading clock edge and an output on line 110 to supply a set signal representing a first delay of the leading clock edge. As shown in FIG. 5, the first delay duration is less than a clock signal period. The DTC 102 also comprises a data clock chain 112 comprising N number of series connected accumulators 114-1 through 114-N. The data clock chain 112 has an input on line 108 to accept the clock signal with the leading clock edge, an input on lines 116-1 through 116-N to accept digital word bit values, and an output on line 118 to supply a reset signal representing a second delay of the leading clock edge, responsive to the digital word. N is the number of bits in the digital word and is therefore directly related to the resolution of the analog output signal. As shown in FIG. 5, the second delay is less than or equal to the clock signal period.

The DTC 102 also includes a phase-to-time logic (PTL) 120 having inputs on lines 110 and 118 to respectively receive the set and reset signals, and an output on line 122 to supply a DTC output (DTC_OUT) signal representing a difference in delay between the set and reset signals.

Figure 2:
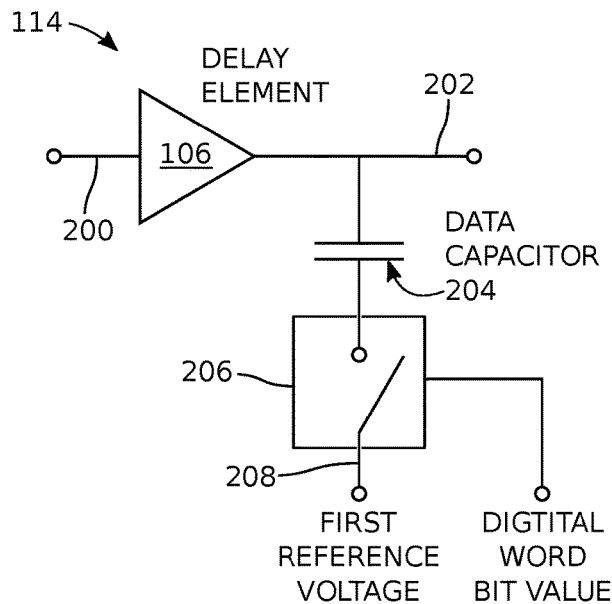
FIG. 2 is a schematic diagram depicting details of the accumulator of FIG. 1.

FIG. 2 is a schematic diagram depicting details of the accumulator of FIG. 1. Each accumulator 114 comprises a delay element 106 having an input on line 200 to accept a corresponding leading clock edge and an output on line 202 to supply a corresponding delayed leading clock edge. A data capacitor 204 has a first terminal connected to the output of the delay element on line 202 and a second terminal. Each data capacitor 204 has a weighted capacitance value responsive to the significance of a corresponding data bit in the digital word. A data switch 206 has a first terminal connected to the second terminal of the data capacitor 204 and a second terminal connected to a first reference voltage on line 208. In one aspect, the first reference voltage is ground. The data switch 206 is selectively closed in response to the binary value of a corresponding bit in the digital word. Delay element 106 has the same duration of delay as the delay elements in the reference clock chain. In one aspect, the delay elements are buffers.

Returning to FIG. 1, the DTC 102 further comprises a data buffer 124 comprising N number of data buffer chains. Shown are data buffer chains 126-1 through 126-N. Data buffer chain 126-1 through 126-N have respective inputs 128-1 through 128-N to accept a corresponding data bit from the digital word, and an output on lines 116-1 through 116-N to selectively close the data switch in a corresponding accumulator in response to the binary value of the data bit. As can be seen, each data buffer chain includes a number of series connected delay elements responsive to the significance of the data bit in the digital word. Data buffer chain 126-1 includes one delay element 130-1. Data buffer chain 126 includes data elements 132-1 and 132-2. Data buffer chain 126-N includes delay elements 134-1 through 134-N. All the delay elements in the data buffer 124 have the same duration of delay as the delay elements in the reference clock chain and the accumulators, and in one aspect they are enabled as buffers.

Figure 3:
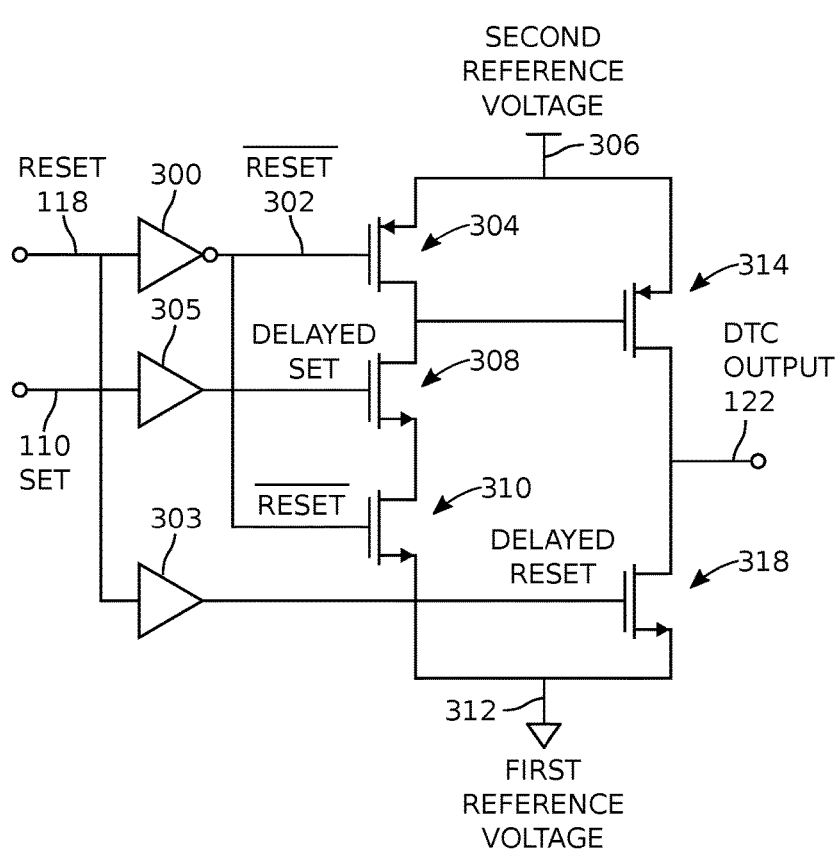
FIG. 3 is a schematic diagram depicting the PTL of FIG. 1 in greater detail.

FIG. 3 is a schematic diagram depicting the PTL of FIG. 1 in greater detail. The PTL 120 comprises an inverter 300 having an input on line 118 to accept the reset signal and an output on line 302 to supply an inverted reset signal with a first delay. A first delay element 303 has an input on line 118 to accept the reset signal and an output to supply a delayed reset signal. A second delay element 305 has an input on line 110 to accept the set signal an output to supply a delayed set signal. The first delay element 303 and second element 305 both have a first delay, equal to the delay of the inverter 300. Delay elements 303 and 305 may be enabled as transmission gates, which act as an RC load to introduce delay, as is well known in the art. However, the delay elements of the PTL are not limited to any particular delay mechanism, and may be enabled using active, passive, or a combination of active and passive components. The delay associated with delay elements 303 and 305 need not be of the same duration as the delay elements located in the reference clock chain and data clock chain. A first p-type metal-oxide-semiconductor (PMOS) transistor 304 has a first source/drain (S/D) connected to a second reference voltage on line 306 having a higher potential than the first reference voltage. For example, if the first reference voltage is ground, the second reference voltage is a positive DC voltage. The first PMOS transistor 304 has a gate to accept the inverted reset signal on line 302 and a second S/D. A first n-type metal-oxide-semiconductor (NMOS) transistor 308 has a first S/D connected to the second S/D of the first PMOS 304, a gate to accept the delayed set signal, and a second S/D.

A second NMOS transistor 310 has a first S/D connected to the second S/D of the first NMOS 308, a gate to accept the inverted reset signal on line 302, and a second S/D connected to the first reference voltage on line 312. A second PMOS transistor 314 has a first S/D connected to the second reference voltage on line 306, a gate connected to the second S/D of the first NMOS 304, and a second S/D to provide the DTC output signal on line 122. A third NMOS transistor 318 has a first S/D connected to the second S/D of the second PMOS 314, a gate to accept the delayed reset signal, and a second S/D connected to the first reference voltage on line 312.

Figure 4A:
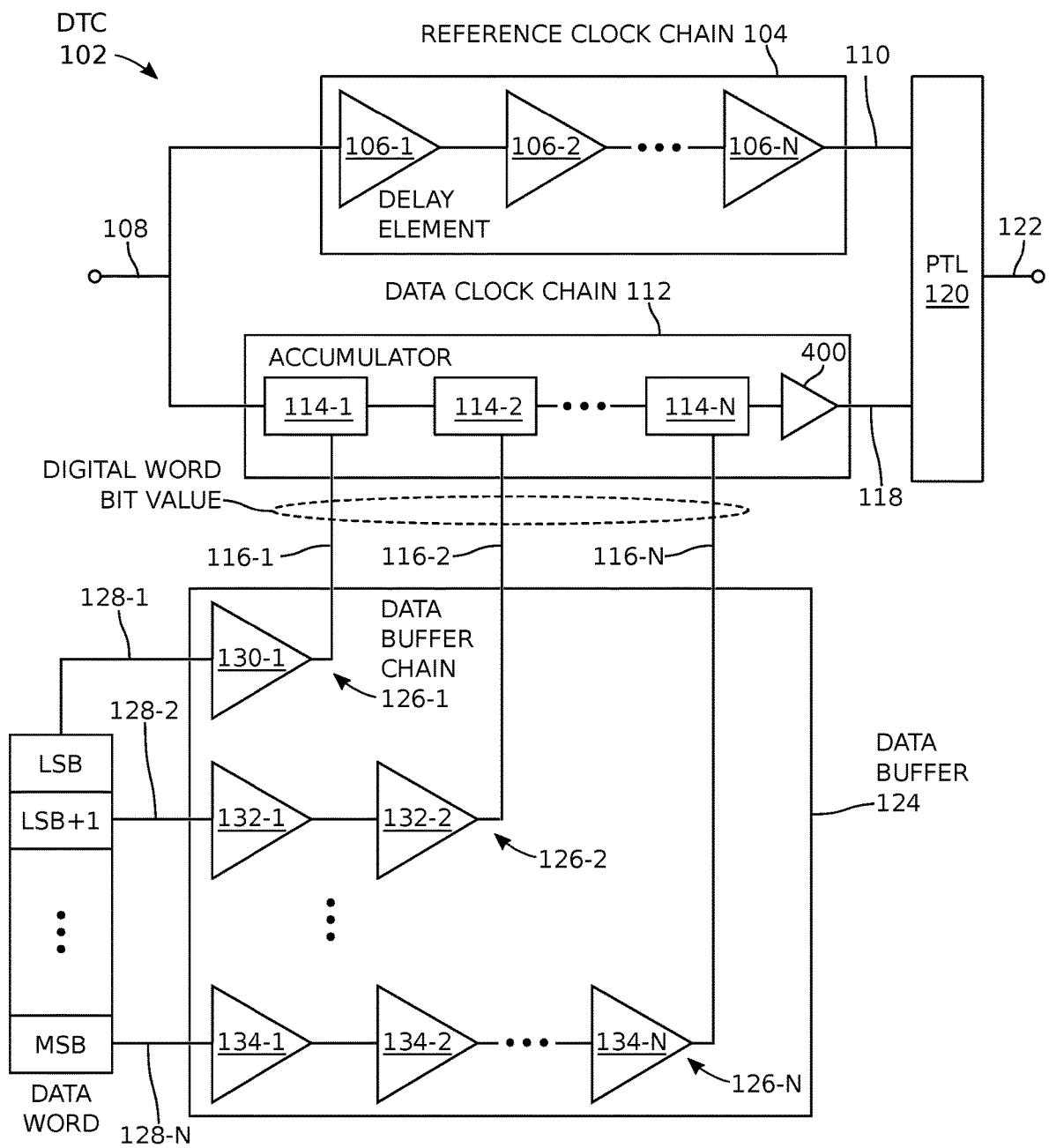
FIGS. 4A and 4B are schematic block diagrams depicting variations of the DTC of FIG. 1.
Figure 4B:
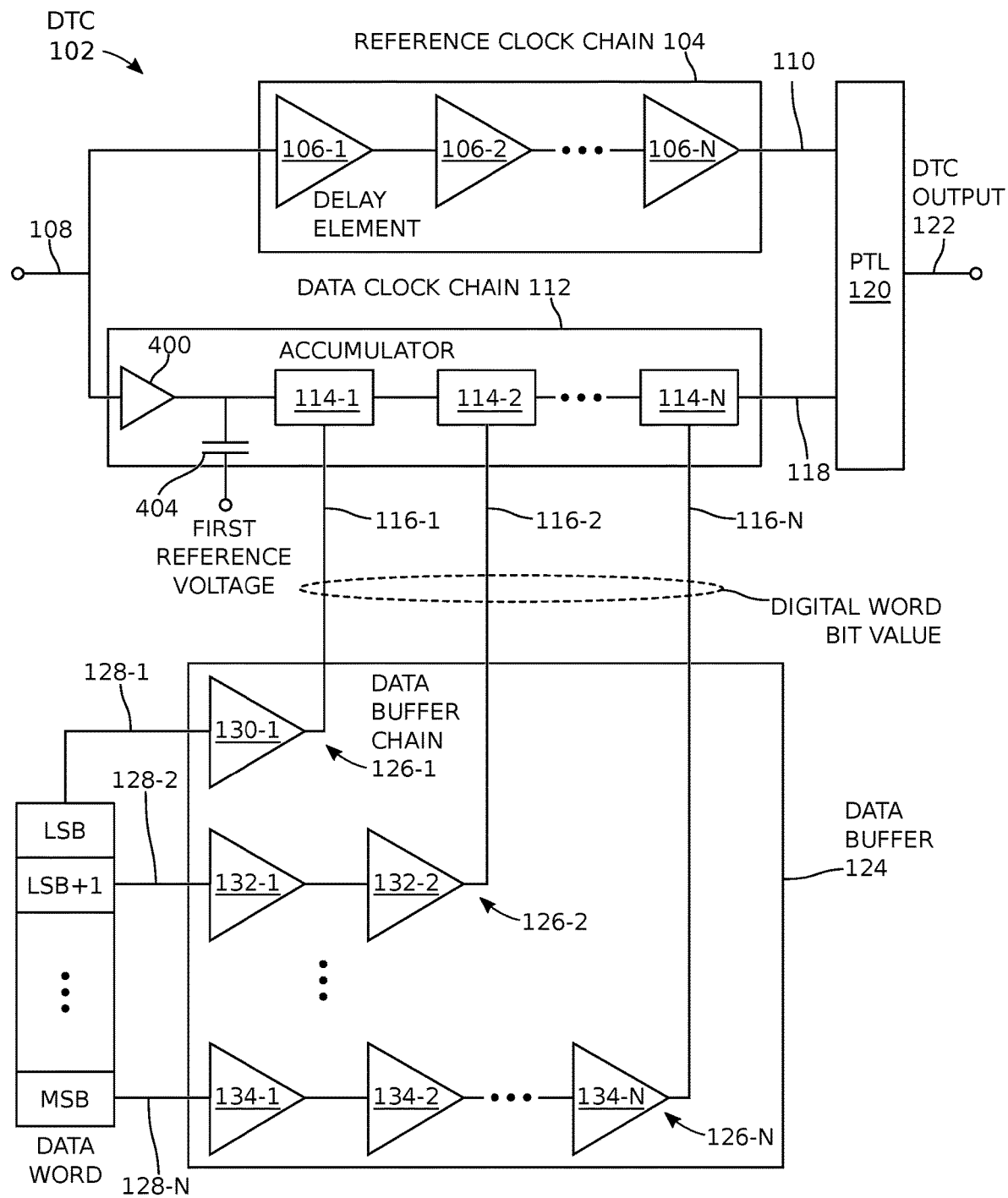

FIGS. 4A and 4B are schematic block diagrams depicting variations of the DTC of FIG. 1. In FIG. 4A the data clock chain 112 further comprises an (N+1)th delay element 400 having an input to accept the delayed leading clock edge from the Nth accumulator, and an output connected to the inverter input to supply the reset signal on line 118 with a delay $T_{PTL}$. Delay $T_{PTL}$ is explained in greater detail below. Alternatively, as shown in FIG. 4B, delay 400 may be placed at the input to the data clock chain 112, with optional capacitor 404. In different aspects, the delay element 400 may be enabled as either a buffer or a transmission gate.

FIG. 5 is a timing diagram. The set signal, which may also be referred to as a delayed clock, has a duty cycle with a first portion 500 of a period, initiated by a set signal leading clock edge 502, followed by a second portion 504 of the period, initiated by a following clock edge 506 opposite in polarity to the set signal leading clock edge 502. The second portion 504 is divided into an initial section 508 and a trailing section 510. As explained below, the initial section 508 and trailing section 510 are associated with the operation of the time-to-voltage converter.

Each accumulator accepts the bit value of a corresponding bit in a digital word in the first portion 512 of the clock period, and is refreshed (reset) in the second portion 514 of the clock period. For example, each accumulator accepts a bit value of a corresponding bit of a first digital word (e.g., 0x3) in a first clock period, and accepts a bit value of a corresponding bit of a second digital word (e.g., 0x5), subsequent to the first digital word, in a second clock period, subsequent to the first clock period.

Figure 6A:
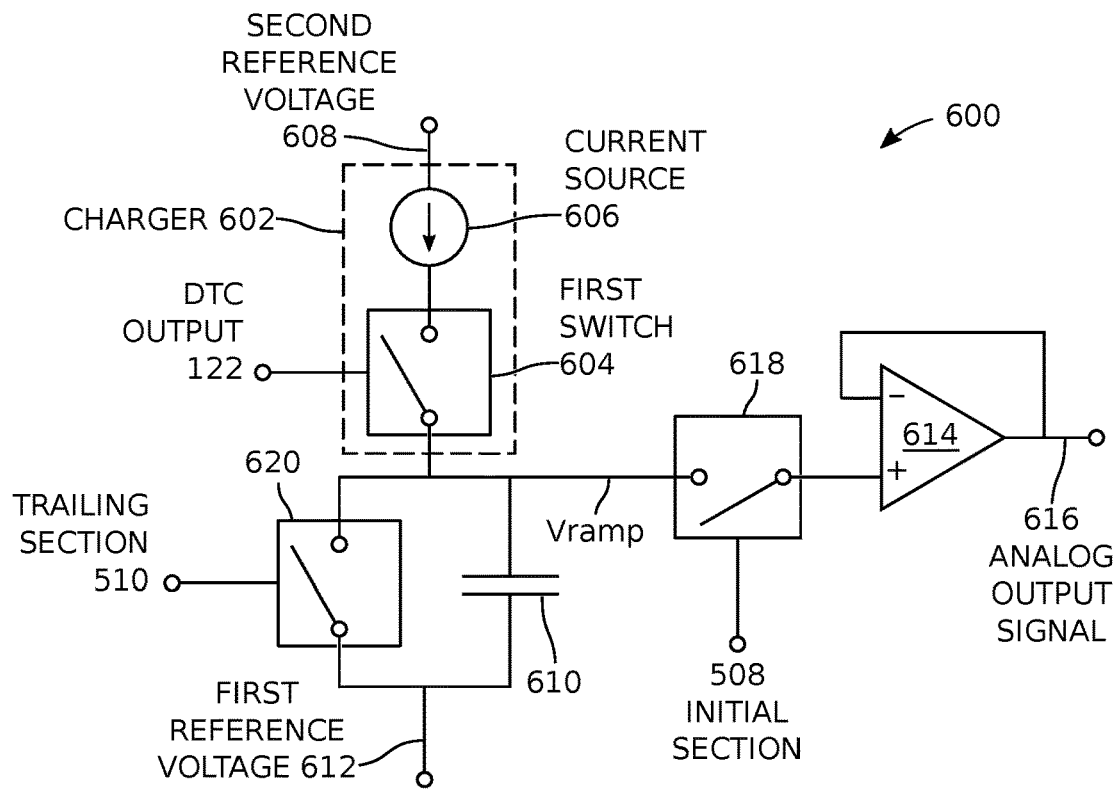
FIGS. 6A and 6B are alternative schematic block diagrams of a time-to-voltage converter (TVC).
Figure 6B:
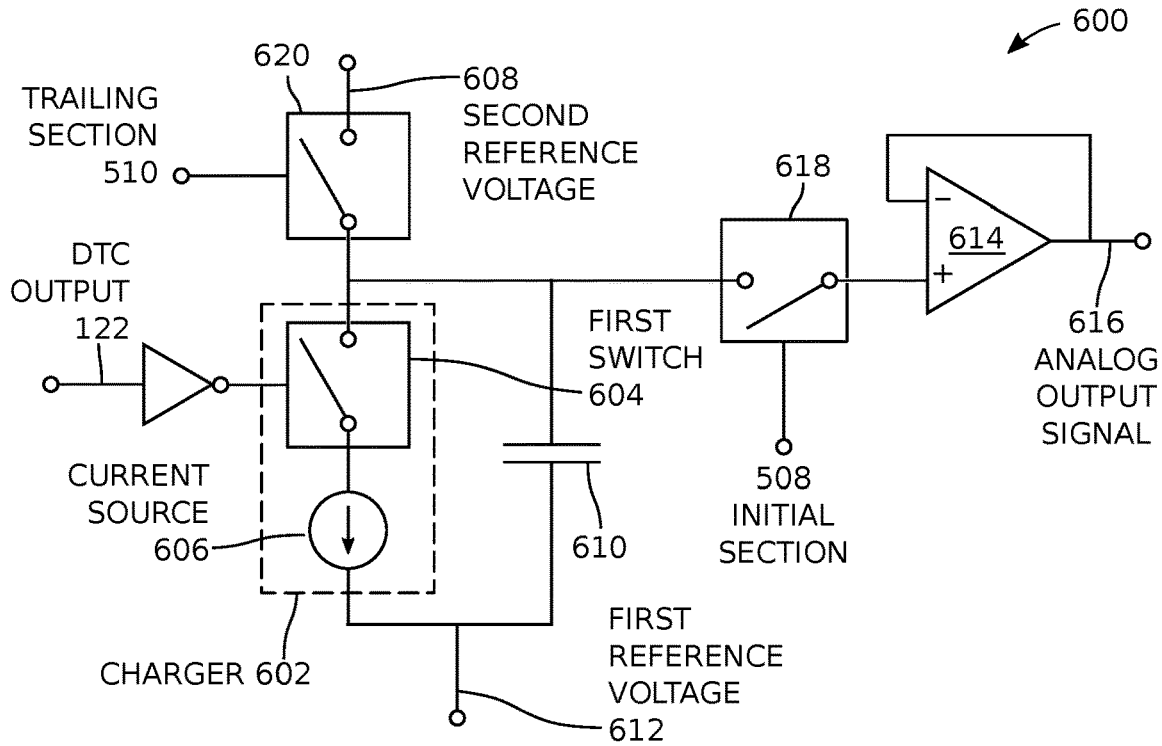

FIGS. 6A and 6B are alternative schematic block diagrams of a time-to-voltage converter (TVC). In FIG. 6A the TVC 600 comprises a charger 602 that includes a first switch 604 having a first terminal and a second terminal that is selectively closed in response to the DTC output signal on line 122. The charger 602 also comprises a current source 606 connected between the second reference voltage on line 608 and the first terminal of the first switch 604.

The TVC 600 further comprises a load capacitor 610 having a first terminal connected to the second terminal of the first switch 604 and a second terminal connected to the first reference voltage on line 612. A buffer amplifier 614 has a non-inverting input, an inverting input, and an output connected to the inverting input, to supply an analog output signal on line 616. A second switch 618 has a first terminal connected to the first terminal of the load capacitor 610 and a second terminal connected to the non-inverting input of the buffer amplifier 614. The second switch 618 is selectively closed during the initial section of the set signal second portion (see FIG. 5, reference designator 508). A third switch 620 has a first terminal connected to the first terminal of the load capacitor 610 and a second terminal connected to the first reference voltage on line 612. The third switch 620 is selectively closed during the trailing section 510 of the set signal second portion.

The voltage at the first terminal of the load capacitor 610 ($V_{ramp}$) is as follows:

$$V_{ramp} = (I_{unit} \cdot DTC\_OUT)/C_{load}$$

where $I_{UNIT}$ represents the current supplied by current source 606.

Alternatively in FIG. 6B, the TVC can be designed using current source topology where the load capacitor 610 is always reset to the second reference voltage (e.g., VDD) and the DTC switches control current sources that draw charge out of the load capacitor. The corresponding output is then equal to:

$$V\text{ramp} = VDD - (I_{unit} * DTC\_Out)/C_{load}$$

Figure 7A:
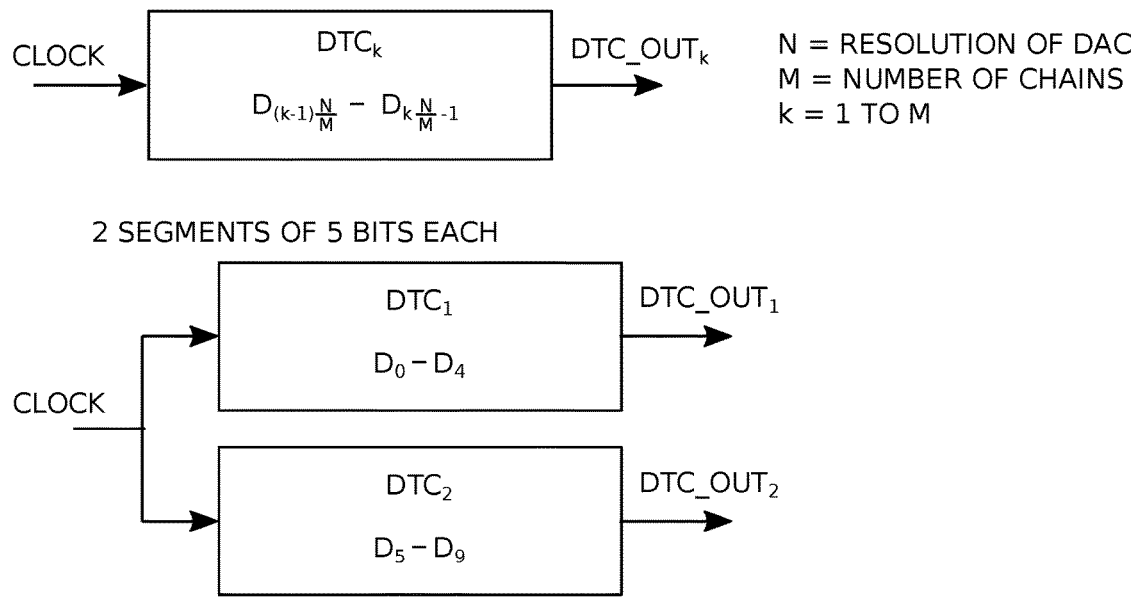
FIGS. 7A and 7B are schematic block diagram depicting a parallel or segmented implementation of the DAC of FIG. 1.
Figure 7B:
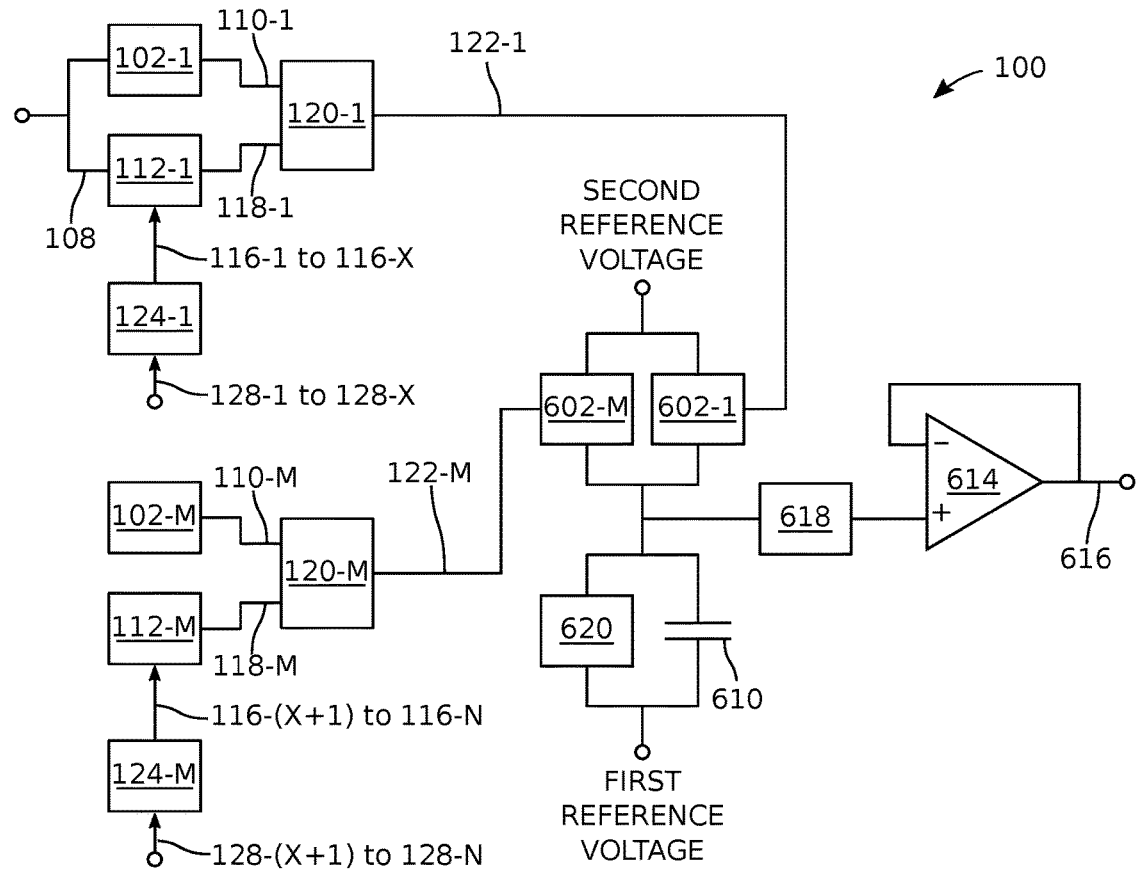

FIGS. 7A and 7B are schematic block diagram depicting a parallel or segmented implementation of the DAC of FIG. 1. This aspect includes a plurality of M data clock chains. Shown in FIG. 7B are data clock chains 112-1 and 112-M. Each data clock chain accepts N/M bit values of a digital word, and has an output, respectively 118-1 and 118-M to supply a corresponding reset signal, where N/M is a positive integer. For simplicity, M=2 in this example. The DAC includes a plurality of M reference clock chains, 102-1 and 102-M, with each reference clock chain associated with a corresponding data clock chain. Likewise, there are M number of data buffers, 124-1 and 124-M, with each data buffer potentially accepting X number of bits of an N bit data word, where N/M=X (N/2=X in this example). In general, N/M is an integer. Also, each segment need not necessarily operate on an equal number of data bits. The DAC includes a plurality of M PTLs, 120-1 and 120-M, with each PTL having an input to accept a reset signal from a corresponding data clock chain, an input to accept a set signal from a corresponding reference clock chain, and an output to supply a corresponding DTC output signal, respectively 122-1 and 122-M. Likewise, the DAC includes a plurality of M chargers, 602-1 and 602-M, with each charger having an input to accept a corresponding DTC output signal and an output connected to the load capacitor 610. The buffer amplifier 614 supplies an analog output signal on line 616 with a resolution of N bits. The operation of the first, second, and third switches is as explained in the description of FIG. 6A, and is not repeated here in the interest of brevity.

FIG. 8 is a schematic block diagram of a differential version of the DAC of FIG. 1. In this aspect of the DAC 100, the reference clock chain comprises a positive reference clock chain 102a to supply a positive set signal, and a negative reference clock chain 102b to supply a negative set signal. The data clock chain comprises a positive data clock chain 112a associated with the positive reference clock chain 102a to supply a positive reset signal, and a negative data clock chain 112b associated with the negative reference clock chain 102b to supply a negative reset signal. In one aspect not shown, the same reference clock chain could be used with both the positive and negative data clock chains.

Each data buffer chain comprises a non-inverted output to selectively close a data switch in a corresponding positive data clock chain accumulator, and an inverted output to selectively close a data switch in a corresponding negative data clock chain accumulator. Likewise, there is a positive PTL 120a to accept the positive set signal on line 110a and positive reset signal on line 118a, and supply a positive DTC output signal on line 122a. A negative PTL 120b accepts the negative set and reset signals, respectively on lines 110b and 118b, and supplies a negative DTC output signal on line 122b. Finally, the TVC comprises a positive TVC 600a to accept the positive DTC output signal on line 122a and supply a positive analog quantity on line 616a. A negative TVC 600b accepts the negative DTC output on line 122b and supplies a negative analog quantity on line 616b. Each of the TVCs operates as explained above in the description of FIG. 6A.

Returning to FIG. 1, a single clock is provided on line 108 as input to two delay chains: the reference clock chain 102 and the data clock chain 112. In both the reference and data clock chains, the clock is buffered through an equal number of delay elements in one aspect of the DTC. In addition, the data signals $Data_1$, $Data_2$, . . . , $Data_N$ are buffered in such a way that the same clock edge is affected for each of the data bits of the same data code as it traverses through the data clock chain. This results in a combined delay or phase accumulation at the input of the Phase-to-Time Logic (PTL) 120, dependent on the input data code. The output (set signal) of the reference clock chain 102 is compared to that of the data clock chain 112 (reset) inside the PTL 120 to produce a time varying quantity. In the simplest aspect of the DTC, the reference clock chain and the data clock chain have the same number of buffers (delay elements), so the propagation delays due to these buffers cancel each other. The only additional delay is due to the capacitor charging and discharging activated by the data bits in the data clock chain.

Returning to FIG. 3, the PTL 120 is a set-reset logic that has a faster decision time as compared to conventional set-reset logic, which is enabled by eliminating the feedback latches. The PTL 120 receives the output of the reference clock chain as the set signal and that of the data clock chain as the reset signal. The logic compares the rising edges of these two clocks and produces a pulse modulated signal depending on the phase difference.

FIG. 9 is a diagram of the PTL truth table. The PTL requires a minimum amount of phase difference between the set and reset signals to make a decision, hence an additional delay offset, $T_{PTL}$ can be introduced in the data clock chain, see FIGS. 4A and 4B. This delay guarantees that the set signal always arrives first, triggering the PTL output to 1 (or the second reference voltage) as it goes from low-to-high. When the reset signal transitions from low-to-high, the PTL output is brought to 0 (or the first reference voltage). This in turn produces phase modulated signals depending on the data code in the data clock chain.

For higher resolutions, multiple DTC chains can be used in parallel (segmentation) to convert the digital code to time domain signals, as explained in the description of FIGS. 7A and 7B. For segmentation, M is the number of parallel DTC chains and N is the number of bits in each data word. Each chain may resolve the same number of bits so that N/M is an integer. All the parallel chains receive the same clock, hence, the parallel DTC outputs are synchronized.

FIG. 10 is a diagram depicting the overall conversion time for a DTC chain. The first half of the set signal duty cycle is used for the DTC operation and the second half is used by the TVC operation. In delay chains, the jitter may accumulate as the clock traverses through the buffers, hence, it must be kept to a minimum as it directly impacts the least significant bit (LSB) of the DTC.

Returning to FIGS. 7A and 7B, the pulse-width modulated signals from the DTC chain on line 122 are sent to the TVC 600. The TVC consists of an integrator, charge sharing switch, and a buffer amplifier. The integrator voltage is given by the equation:

$$V\text{ramp}=(I_{unit}*\text{DTC\_Out})/C_{load}$$

The current $I_{unit}$ and $C_{load}$ (610) is kept constant while DTC_Out on line 122 is a time varying quantity depending on the input data code to the DTC. This result is a time varying voltage $V_{ramp}$ depicted in FIG. 5. $V_{ramp}$ is then transferred to the input of the high speed buffer amplifier 614 during the Clk_transfer (initial section of the second period). At the end of the Clk_transfer, Vramp is reset to ground discharging all the charge from the $C_{load}$ capacitor by the third (reset) switch. This is similar to a Return-to-Zero operation in current steering DACs. The benefit of this approach is that the capacitor, $C_{load}$ always charges up from ground potential and eliminates any memory effect from the previous sample. The voltage at the input of the buffer amplifier 614 is a Non-Return-to-Zero signal. The buffer amplifier has a gain of 1 and finally buffers the analog signal out.

Figure 11:
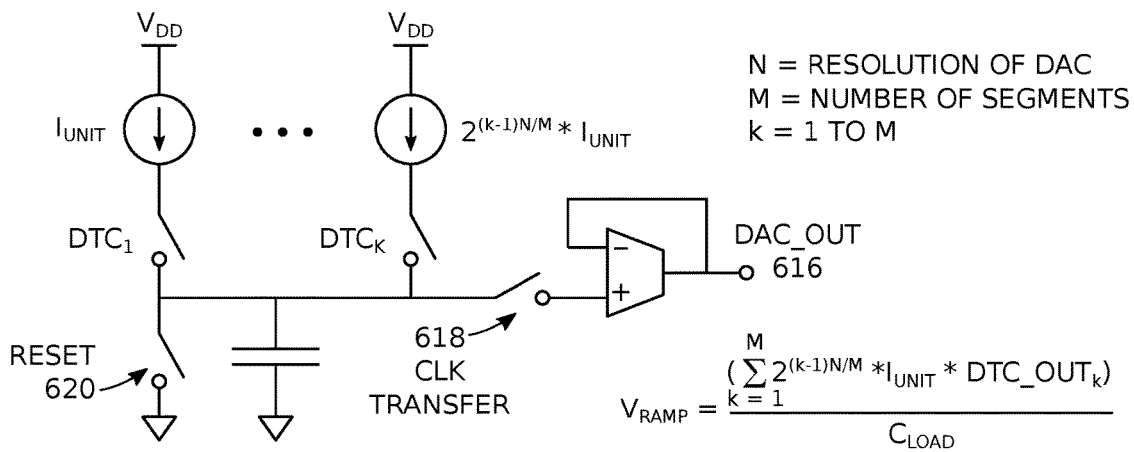
FIG. 11 is a schematic depicting a segmented TVC.

FIG. 11 is a schematic depicting a segmented TVC. As shown in FIGS. 7A and 7B, when segmentation is used in the DTC, the TVC must be modified to receive each of these DTC outputs with individual switches and current sources as shown. The $V_{ramp}$ voltage is the sum of the total charge deposited on the capacitor by each of the individual charger, and can be expressed as shown in FIG. 11.

In both the segmented and non-segmented versions of the phase accumulation DAC, the introduction of a fixed delay offset $T_{PTL}$ deposits a fixed amount of charge on the load capacitor $C_{load}$ in each TVC operation cycle. This can be removed by a differential implementation of the DTC and TVC depicted in FIG. 8. Since the TPTL offset is common to both analog outputs, it is canceled, leaving a pure analog output containing only phase information from the corresponding digital word. In the segmented system, the introduction of this fixed delay offset proves to be beneficial as all the individual TVC switches are turned on during every TVC cycle operation regardless of the corresponding data bits, thereby, reducing the effect of glitches on $V_{ramp}$.

Figure 12:
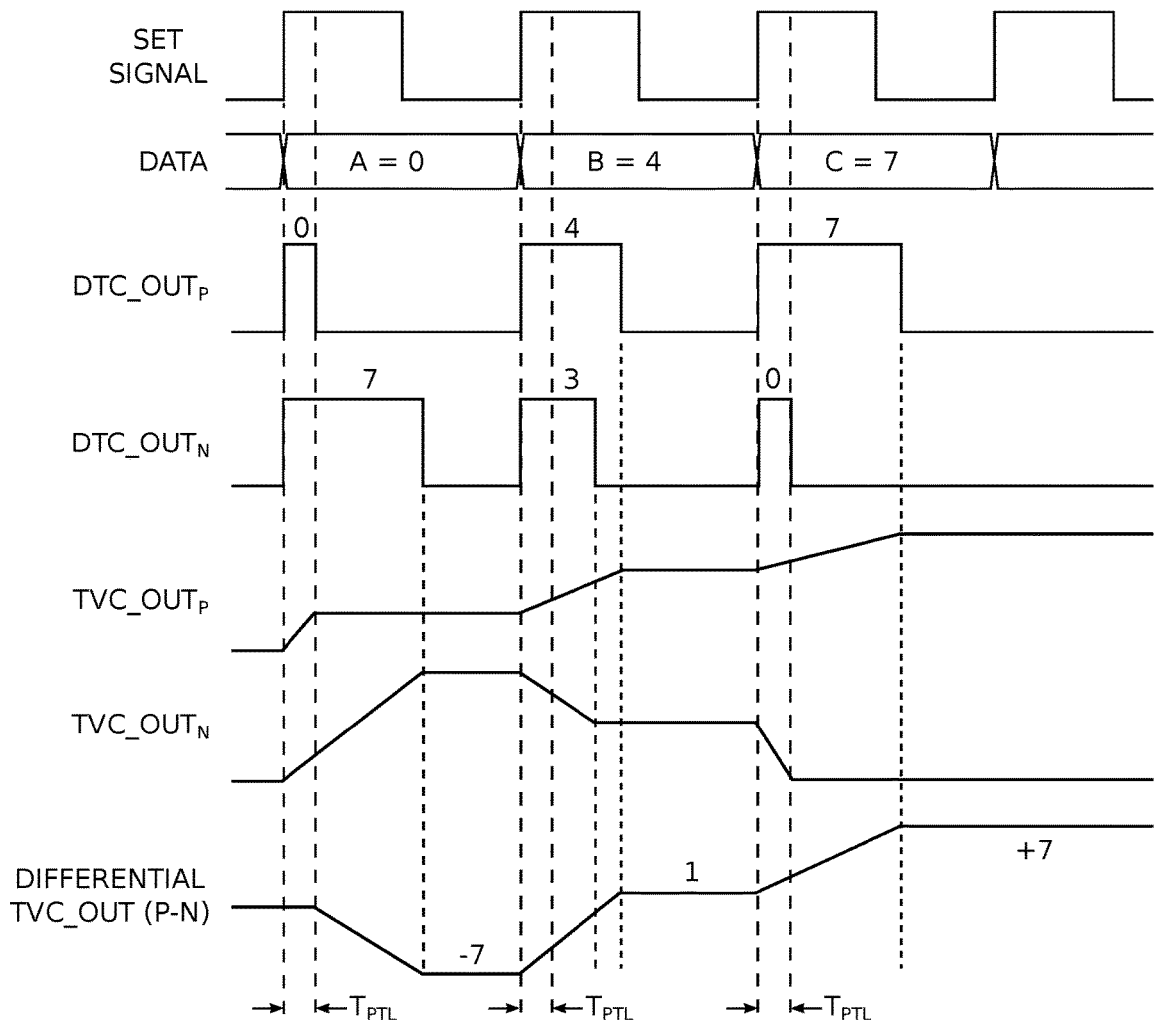
FIG. 12 is a timing diagram for the differential DAC of FIG. 8.

FIG. 12 is a timing diagram for the differential DAC of FIG. 8.

Figure 13:
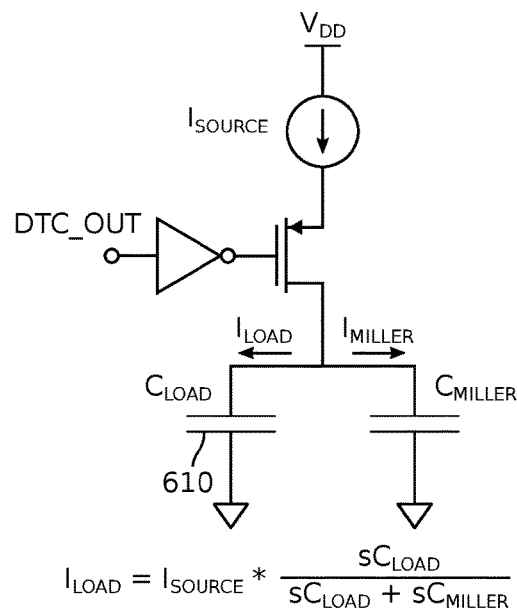
FIG. 13 is a schematic diagram depicting the Miller effect in the TVC, which may cause glitches.

FIG. 13 is a schematic diagram depicting the Miller effect in the TVD, which may cause glitches. The glitch energy on $V_{ramp}$ is largely dependent on the Miller effect of the individual TVC switches, and it can be further minimized by increasing the size of the load capacitor, $C_{load}$ as shown.

Figure 14:
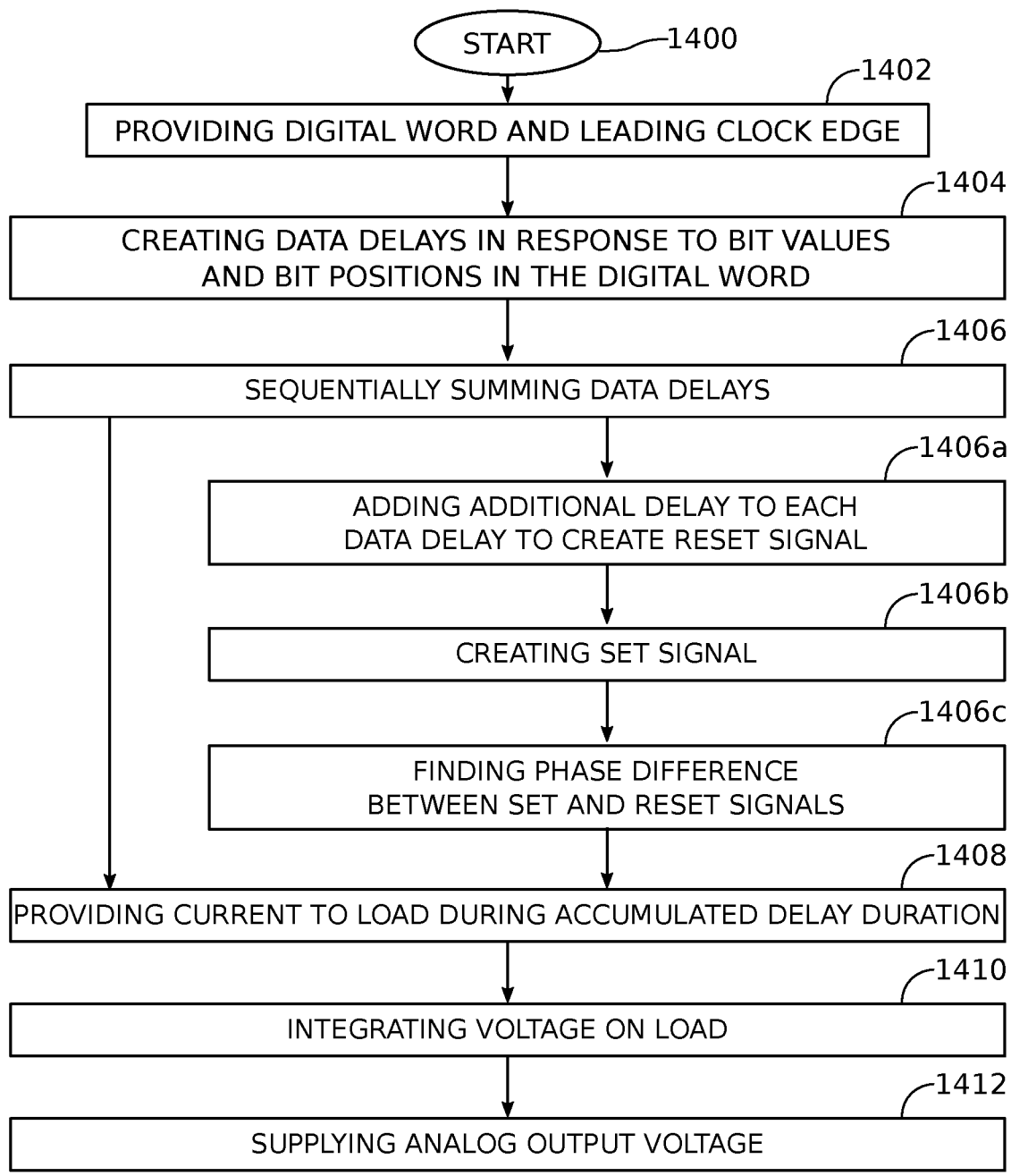
FIG. 14 is a flowchart illustrating a phase accumulation method for converting a digital word to an analog signal.

FIG. 14 is a flowchart illustrating a phase accumulation method for converting a digital word to an analog signal. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 1400.

Step 1402 accepts a binary coded digital word and a clock signal initiated by a leading clock edge. For each data bit in the digital word, Step 1404 creates a data delay referenced to the leading clock edge, responsive to the bit value and the significance of the data bit in the digital word. Step 1406 sequentially sums the data delays from each accumulator for the digital word to create an accumulated delay duration in each clock signal period. Step 1408 provides a constant value current to a load during the accumulated delay duration. Step 1410 integrates the voltage on the load, and Step 1412 supplies an analog output signal responsive to the integrated voltage.

In one aspect, accepting the digital word in Step 1402 includes accepting a digital word with N number of data bits. Then, sequentially summing the data delays from each accumulator in Step 1406 includes substeps. Step 1406*a* adds a first delay to each of N sequential data delay summings to create a reset signal. Step 1406*b* creates a set signal having a duration equal to N first delays. Step 1406*c* finds the phase difference (the difference in delay) between the set and reset signals to create the accumulated delay duration.

A system and method have been provided for a phase accumulation DAC. Examples of particular message structures and circuits have been presented to illustrate the invention. However, the invention is not limited to merely these examples. Other variations and embodiments of the invention will occur to those skilled in the art.

I claim:

1. A phase accumulation digital-to-analog converter (DAC) comprising:
   a digital-to-time converter (DTC) comprising:
      a reference clock chain comprising N series connected delay elements, having an input to accept a clock signal with a leading clock edge and an output to supply a set signal representing a first delay of the leading clock edge, where the first delay duration is less than a clock signal period;
      a data clock chain comprising N series connected accumulators, having an input to accept the clock signal with the leading clock edge, an input to accept a digital word bit value, and an output to supply a reset signal representing a second delay of the leading clock edge, responsive to the digital word, where the second delay is less than or equal to the clock signal period; and,
      a phase-to-time logic (PTL) having inputs to receive the set and reset signals and an output to supply a DTC output signal representing a difference in delay between the set and reset signals.

2. The DAC of claim 1 wherein each accumulator comprises:
   a delay element having an input to accept a corresponding leading clock edge and an output to supply a corresponding delayed leading clock edge;
   a data capacitor having a first terminal connected to the output of the delay element and a second terminal, where each data capacitor has a weighted capacitance value responsive to the significance of a corresponding data bit in the digital word; and,
   a data switch having a first terminal connected to the second terminal of the data capacitor and a second terminal connected to a first reference voltage, selectively closed in response to the corresponding digital word bit value.

3. The DAC of claim 2 wherein the DTC further comprises:
   a data buffer comprising:
      N data buffer chains, each data buffer chain having an input to accept a corresponding data bit from the digital word, and an output to selectively close the data switch in a corresponding accumulator in response to the digital word bit value, where each data buffer chain includes a number of series connected delay elements responsive to the significance of the data bit in the digital word.

4. The DAC of claim 1 wherein the PTL comprises:
   an inverter having an input to accept the reset signal and an output to supply an inverted reset signal with a first delay;
   a first delay element having an input to accept the reset signal and an output to supply a delayed reset signal with the first delay;
   a second delay element having an input to accept the set signal and an output to supply a delayed set signal with the first delay;
   a first p-type metal-oxide-semiconductor (PMOS) transistor having a first source/drain (S/D) connected to a second reference voltage having a higher potential than the first reference voltage, a gate to accept the inverted reset signal, and a second S/D;

a first n-type metal-oxide-semiconductor (NMOS) transistor having a first S/D connected to the second S/D of the first PMOS, a gate to accept the delayed set signal, and a second S/D;

a second NMOS transistor having a first S/D connected to the second S/D of the first NMOS, a gate to accept the inverted reset signal, and a second S/D connected to the first reference voltage;

a second PMOS transistor having a first S/D connected to the second reference voltage, a gate connected to the second S/D of the first NMOS, and a second S/D to provide the DTC output signal; and, a third NMOS transistor having a first S/D connected to the second S/D of the second PMOS, a gate to accept the delayed reset signal, and a second S/D connected to the first reference voltage.

5. The DAC of claim 4 wherein the data clock chain further comprises:

an (N+1)th delay element having an input to accept the delayed leading clock edge from the Nth accumulator, and an output connected to the inverter input to supply the reset signal with a delay $T_{PTL}$.

6. The DAC of claim 3 wherein the set signal has a duty cycle with a first portion of a period, initiated by a set signal leading clock edge, followed by a second portion of the period, initiated by a following clock edge opposite in polarity to the set signal leading clock edge, wherein the second portion is divided into an initial section and a trailing section;

the DAC further comprising:
a time-to-voltage converter (TVC) comprising:
a charger comprising:
a first switch having a first terminal and a second terminal, selectively closed in response to the DTC output signal;
a current source connected between the second reference voltage and the first terminal of the first switch;
a load capacitor having a first terminal connected to the second terminal of the first switch and a second terminal connected to the first reference voltage;
a buffer amplifier having a non-inverting input, an inverting input, and an output connected to the inverting input, supplying an analog output signal;
a second switch having a first terminal connected to the first terminal of the load capacitor and a second terminal connected to the non-inverting input of the buffer amplifier, selectively closed during the initial section of the set signal second portion; and,
a third switch having a first terminal connected to the first terminal of the load capacitor and a second terminal connected to the first reference voltage, selectively closed during the trailing section of the set signal second portion.

7. The DAC of claim 6 wherein each accumulator accepts the binary bit value of a corresponding digital word bit in the first portion of the clock period, and is refreshed in the second portion of the clock period.

8. The DAC of claim 7 wherein each accumulator accepts a binary bit value of a corresponding bit of a first digital word in a first clock period; and, wherein each accumulator accepts a binary bit value of a corresponding bit of a second digital word, subsequent to the first digital word, in a second clock period, subsequent to the first clock period.

9. The DAC of claim 6 further comprises:
a plurality of M data clock chains, each data clock chain accepting N/M bit values of a digital word, and having an output to supply a corresponding reset signal, where N/M is a positive integer;
a plurality of M reference clock chains, each reference clock chain associated with a corresponding data clock chain;
a plurality of M PTLs, each PTL having an input to accept a reset signal from a corresponding data clock chain, an input to accept a set signal from a corresponding reference clock chain, and an output to supply a corresponding DTC output signal;
a plurality of M chargers, each charger having an input to accept a corresponding DTC output signal and an output connected to the load capacitor; and,
wherein the buffer amplifier supplies an analog output signal with a resolution of N bits.

10. The DAC of claim 6 wherein the reference clock chain comprises:
a positive reference clock chain to supply a positive set signal;
a negative reference clock chain to supply a negative set signal;
wherein the data clock chain comprises:
a positive data clock chain associated with the positive reference clock chain to supply a positive reset signal;
a negative data clock chain associated with the negative reference clock chain to supply a negative reset signal;
wherein each data buffer chain comprises:
a non-inverted output to selectively close a data switch in a corresponding positive data clock chain accumulator;
an inverted output to selectively close a data switch in a corresponding negative data clock chain accumulator;
wherein the PTL comprises:
a positive PTL to accept the positive set and reset signals, and supply a positive DTC output signal;
a negative PTL to accept the negative set and reset signals, and supply a negative DTC output signal;
wherein the TVC comprises:
a positive TVC to accept the positive DTC output signal and supply a positive analog quantity; and,
a negative TVC to accept the negative DTC output and supply a negative analog quantity.

11. A phase accumulation method for converting a digital word to an analog signal, the method comprising:
accepting a binary coded digital word and a clock signal initiated by a leading clock edge;
for each data bit in the digital word, creating a data delay referenced to the leading clock edge, responsive to the bit value and the significance of the data bit in the digital word;
sequentially summing the data delays from each accumulator for the digital word to create an accumulated delay duration in each clock signal period;
providing a constant value current to a load during the accumulated delay duration;
integrating a voltage on the load; and,
supplying an analog output signal responsive to the integrated voltage.

12. The method of claim 11 wherein accepting the digital word includes accepting a digital word with N number of data bits;

wherein sequentially summing the data delays from each accumulator to create accumulated delay duration includes:
adding a first delay to each of N sequential data delay summings to create a reset signal;

creating a set signal having a duration equal to N first delays;

finding the phase difference between the set and reset signals to create the accumulated delay duration.

13. A digital-to-time converter (DTC) comprising:

a reference clock chain comprising N series connected delay elements, having an input to accept a clock signal with a leading clock edge and an output to supply a set signal representing a first delay of the leading clock edge, where the first delay is less than a clock signal period;

a data clock chain comprising N series connected accumulators, having an input to accept the clock signal with the leading clock edge, an input to accept a digital word bit value, and an output to supply a reset signal representing a second delay of the leading clock edge, responsive to the digital word, where the second delay is less than or equal to the clock signal period; and, a phase-to-time logic (PTL) having inputs to receive the set and reset signals and an output to supply a DTC output signal representing a difference in delay between the set and reset signals.

14. The DTC of claim 13 wherein each accumulator comprises:

a delay element having an input to accept a corresponding leading clock edge and an output to supply a corresponding delayed leading clock edge;

a data capacitor having a first terminal connected to the output of the delay element and a second terminal, where each data capacitor has a weighted capacitance value responsive to the significance of a corresponding data bit in the digital word; and, a data switch having a first terminal connected to the second terminal of the data capacitor and a second terminal connected to a first reference voltage, selectively closed in response to the corresponding digital word bit value.

15. The DTC of claim 14 further comprising:

a data buffer comprising:

N data buffer chains, each data buffer chain having an input to accept a corresponding data bit from the digital word, and an output to selectively close the data switch in a corresponding accumulator in response to the digital word bit value, where each data buffer chain includes a number of series connected delay elements responsive to the significance of the data bit in the digital word.

16. A phase-to-time logic (PTL) comprising:

a first p-type metal-oxide-semiconductor (PMOS) transistor having a first source/drain (S/D) connected to a second reference voltage having a higher potential than the first reference voltage, a gate to accept the inverted reset signal, and a second S/D;

a first n-type metal-oxide-semiconductor (NMOS) transistor having a first S/D connected to the second S/D of the first PMOS, a gate to accept a delayed set signal, and a second S/D;

a second NMOS transistor having a first S/D connected to the second S/D of the first NMOS, a gate to accept the inverted reset signal, and a second S/D connected to the first reference voltage;

a second PMOS transistor having a first S/D connected to the second reference voltage, a gate connected to the second S/D of the first NMOS, and a second S/D to provide the DTC output signal; and, a third NMOS transistor having a first S/D connected to the second S/D of the second PMOS, a gate to accept a delayed reset signal, and a second S/D connected to the first reference voltage.

* * * * *